(12) United States Patent
Henderson et al.

(10) Patent No.: US 6,530,157 B1
(45) Date of Patent: Mar. 11, 2003

(54) PRECISE POSITIONING DEVICE FOR WORKPIECES

(75) Inventors: Robert D. Henderson, PHX, AZ (US); Matthew J. Gossett, Scottsdale, AZ (US); Dennis Turensky, Lompoc, CA (US)

(73) Assignee: Process Integration, Gilbert, AZ (US)

( * ) Notice: Subject to any disclaimer, the term of this patent is extended or adjusted under 35 U.S.C. 154(b) by 0 days.

(21) Appl. No.: 09/946,002

(22) Filed: Sep. 4, 2001

(51) Int. Cl.[7] ............................................. B65G 47/24
(52) U.S. Cl. ............................ 33/644; 33/520; 33/645; 414/935
(58) Field of Search ........................... 33/520, 533, 613, 33/645, 573, 644; 414/945, 936; 359/391

(56) References Cited

U.S. PATENT DOCUMENTS

| | | | |
|---|---|---|---|
| 2,345,312 A | * 3/1944 | Sorensen | 33/174 |
| 3,210,855 A | * 10/1965 | Carter et al. | 33/520 |
| 3,537,603 A | 11/1970 | Willis | |
| 4,093,859 A | * 6/1978 | Davis et al. | 250/445 |
| 4,498,833 A | * 2/1985 | Hertel | 414/217 |
| 4,685,551 A | 8/1987 | Ono et al. | |
| 4,723,086 A | * 2/1988 | Leibovich et al. | 310/328 |
| 5,000,113 A | 3/1991 | Wang et al. | |
| 5,054,991 A | * 10/1991 | Kato | 414/783 |
| 5,061,144 A | 10/1991 | Akimoto et al. | |
| 5,365,672 A | * 11/1994 | Kato | 33/520 |
| 5,566,466 A | 10/1996 | Hearne | |
| 5,643,366 A | 7/1997 | Somekh et al. | |
| 5,810,935 A | 9/1998 | Lee et al. | |
| 5,823,736 A | 10/1998 | Matsumura | |
| 5,885,054 A | 3/1999 | Kato | |
| 6,012,192 A | 1/2000 | Sawada | |
| 6,052,913 A | * 4/2000 | Kaneko et al. | 33/645 |
| 6,146,463 A | 11/2000 | Yudovsky et al. | |
| 6,340,281 B1 | * 1/2002 | Haraguchi et al. | 414/783 |

* cited by examiner

*Primary Examiner*—Diego Gutierrez
*Assistant Examiner*—Amanda J Hoolahan
(74) *Attorney, Agent, or Firm*—Womack & Associates; Stewart J. Womack

(57) ABSTRACT

The invention is a multiple size workpiece positioning device for the precise positioning or centering of workpieces, such as semiconductor wafers, in a processing station. The inventive includes a plurality of ring bars that may be pivoted on one end. The distal end of the ring bars form a circular shape that may decrease or increase in diameter as the ring bars are pivoted. This movement may be used to position or center the workpiece. A single combination pin or two pins of different heights may be mounted on the distal end of the ring bars. A combination pin or a rest pin and an alignment pin may be used to support the bottom of the workpiece to provide a contact point for an urging force on the edge of the workpiece.

10 Claims, 13 Drawing Sheets

PRECISE POSITIONING DEVICE FOR WORKPIECES

TECHNICAL FIELD

The present invention relates generally to a workpiece positioning devices. For a specific example, it may center a wafer that is within a range of sizes over a chuck. The workpiece, once precisely positioned, is ready for processing.

BACKGROUND OF THE INVENTION

Workpiece positioning devices are well known in the art. One type of positioning device utilizes a centering ring that accepts different sized semiconductor wafers without changes to the system hardware. The wafer is placed in the centering ring and gravity urges the periphery of the wafer to slide along the walls of the centering ring to thereby center the wafer in the centering ring.

One problem with conventional centering rings is the use of stepped circles of different diameters that allow different sized wafers to fall into different sized concentric rings. Occasionally the wafer slides unevenly along the walls of the centering ring and gravity is insufficient to properly center the wafer within the concentric rings.

Another problem with centering rings is that foreign material, for example photo resist or flux used during the processing of a previous wafer, may cause the wafer to stick to the edges of the centering ring. This prevents the wafer from being accurately centered prior to processing.

Another problem with centering rings is that the centering ring typically has to swing into proper position for positioning the wafer and then must swing away from the processing station to allow for further processing of the wafer. This may causes particles to fall on the wafer prior to being processed.

Centering rings are particularly unsuited for wafers that require extreme accuracy, repeatability, reliability, and minimum particle generation. What is needed is a positioning device that accurately centers a wafer or other workpiece, is repeatable and reliable and produces a minimum amount of particles while avoiding the problems of the prior art.

SUMMARY OF THE INVENTION

The different embodiments of the invention may include one or more of the following objectives. One objective is to provide a workpiece positioning device that centers a workpiece that is within a range of sizes. All workpieces within the range may be centered without making modifications to the hardware of the positioning device.

Another object is to provide a positioning device that uses sensors/torque limiters to accurately center different sized workpieces without applying excessive pressure on the workpiece that might damage the workpiece.

Another object is to provide a positioning device that minimizes particle generation, particularly above the top surface of the workpiece.

Another object is to provide a positioning device that quickly centers the workpiece thereby improving the throughput of the processing station.

Another object is to provide a positioning device that may be used in combination with a variety of processing stations.

Another object is to center any semiconductor wafer that is within a range of sizes. All wafers within the range of sizes may be centered in a semiconductor processing station without modifying the positioning device. The positioning device is particularly useful for positioning semiconductor wafers larger than 50 mm in diameter.

The present invention provides a new positioning device that may be used with a range of workpiece sizes without modifying the hardware of the positioning device. The workpiece positioning device may includes a housing, a plurality of rotational shafts mounted from the housing extending generally in a vertical direction, a motor, a coupling mechanism coupling the motor to the plurality of rotational shafts, and a plurality of ring bars. A first end of each ring bar may be connected to one of the rotational shafts and each ring bar may extend generally in a horizontal direction. In a preferred embodiment, there are six (6) rotational shafts that are substantially equally spaced apart along a circumference of a circle. The ring bars extending from the rotational shafts may lay along the circumference of the circle.

Additional embodiments of the invention may include one or more of the following features. An alignment pin may be mounted on the distal end of one or more of the plurality of ring bars to assist in contacting the workpiece during the positioning process. A plurality of rest pins, preferably shorter and in front of the alignment pins, may also be mounted on the distal end of one or more of the plurality of ring bars to support the workpiece. A plurality of combination pins may be used instead of the rest and alignment pins. A torque limiter may be coupled to the motor to limit the amount of stress placed on the workpiece during the positioning process. Excessive stress might damage or destroy the workpiece.

The coupling mechanism for transferring motion generated by the motor to rotate the rotational shafts may take many different forms. Methods of transferring motion generated by a motor to a plurality of shafts are well known and particular embodiments of the invention may include these known methods. Non-limiting examples of some of the known methods include various configurations of levers, belt drive pulleys, pulley bearings, belts, and/or various configurations of gears.

The preferred coupling mechanism includes a plurality of belt drive pulleys, a plurality of pulley bearings, and a belt. The belt may be operably coupled to the motor, the plurality of belt drive pulleys, and the plurality of pulley bearings. Each belt drive pulley is preferably operably coupled to one of the rotation shafts. The motor is thus able to simultaneously rotate the plurality of rotation shafts in a clockwise direction or simultaneously rotate the plurality of rotation shafts in a counter-clockwise direction.

In operation, a workpiece may be centered over a particular location of a processing station by performing the following steps. The workpiece may be positioned with a robotic end effector above, and then placed on, a distal end for each of a plurality of ring bars. The workpiece is preferably rested on one or more rest pins attached to the distal end of the plurality of ring bars. A motor may simultaneously rotate a plurality of rotation shafts in a first direction, i.e. clockwise or counter-clockwise, thereby arcing the distal end for each of the plurality of ring bars towards the workpiece. This will result in the distal ends of the plurality of ring bars substantially uniformly urging the workpiece towards a particular location within the processing station. Alignment pins are preferably attached to the distal end of the ring bars and contact the workpiece during the urging of the workpiece. In a preferred embodiment, a dithering motion by the alignment pins at the end of the urging step may be used to improve the accuracy of the alignment procedure. In one embodiment of the invention, a chuck may be raised to accept, possibly by vacuum, a centered wafer. The ring bars may be removed from the processing station by rotating the plurality of rotation shafts in a second direction thereby arcing the distal end for each of the plurality of ring bars away from the workpiece. The workpiece may then be processed as it is centered on the chuck and the ring bars have been removed from the processing station. In a preferred embodiment, the processing station performs a flux spin coating process on a semiconductor wafer. After the workpiece en processed, the plurality of rotation shafts may be simultaneously rotated in the similar first direction again thereby arcing the distal end for each of the plurality of ring bars towards and below the workpiece. The chuck may lower and rest the workpiece on the rest pins. This allows space beneath the workpiece for an end effector to grip the workpiece, possibly by vacuum, and remove the workpiece from the processing station.

Another method for positioning a wafer in a processing station uses a plurality of combination pins mounted on a distal end of a plurality of ring bars. The combination pins may be arced inward to be below the wafer and the wafer lowered onto the combination pins, preferably by a robotic end effector. The end effector may be moved away from the processing station to allow a chuck to lift the wafer off the combination pins. The combination pins may be arced away from the wafer to give room for the chuck to lower the wafer to the same height as the combination pins. The combination pins may be arced toward the wafer so that the combination pins contact the edge of the wafer and urge the wafer toward a desired position. The combination pins may be arced away from the wafer and the processing station to allow for processing of the wafer. After the process, the chuck may raise the wafer and allow the combination pins to arc beneath the wafer. The chuck may lower the wafer onto the combination pins, thereby giving room for an end effector or other device to remove the wafer from the processing station.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF EXEMPLARY EMBODIMENTS

An improved method and apparatus for positioning a workpiece in a processing station will now be described. In the following description, numerous specific details are set forth illustrating Applicants' best mode for practicing the invention and enabling one of ordinary skill in the art to make and use the invention. It will be obvious, however, to one skilled in the art that the present invention may be practiced without these specific details. In other instances, well-known machines and process steps have not been described in particular detail in order to avoid unnecessarily obscuring the present invention.

Figure 1:
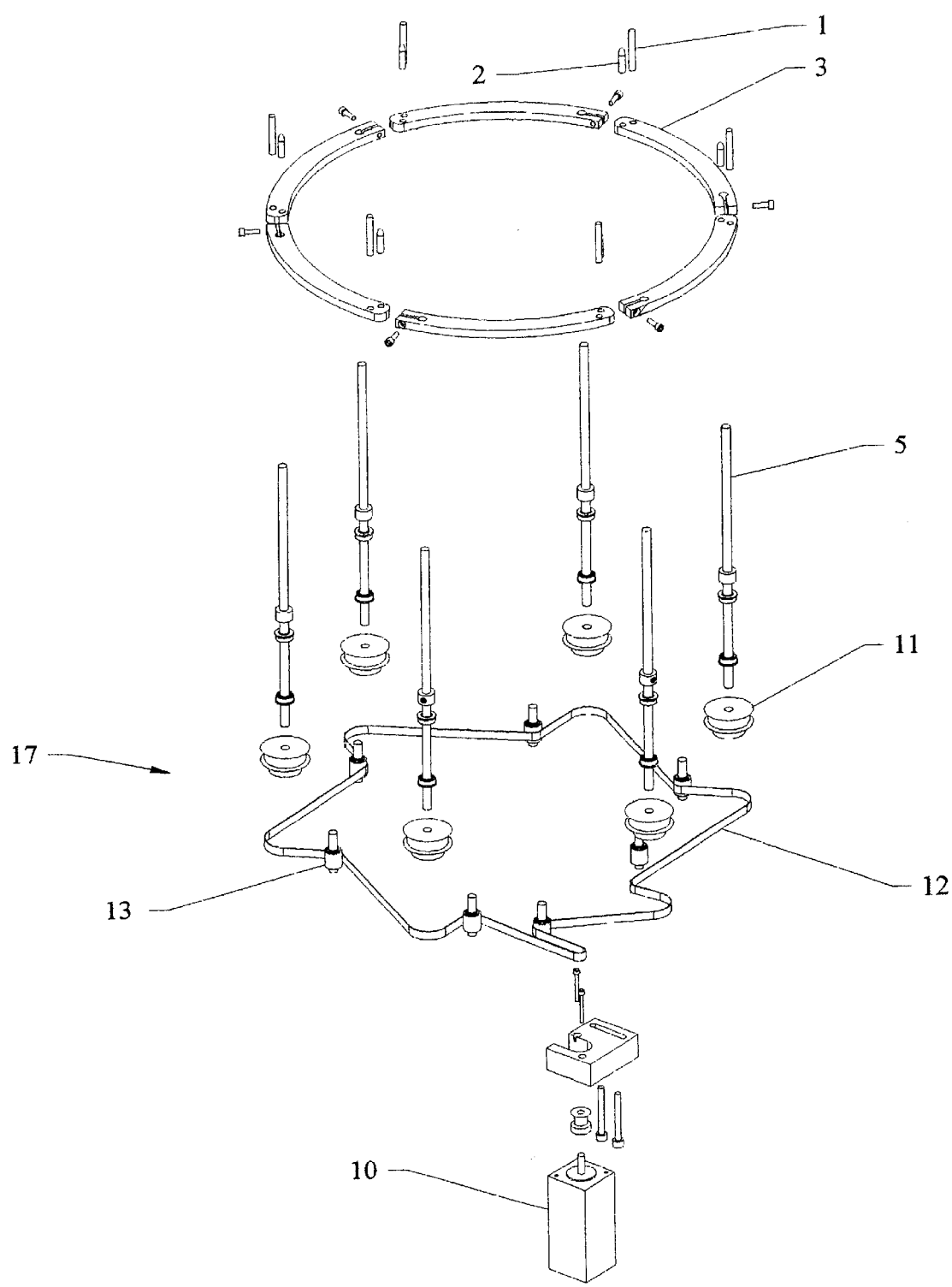
FIG. 1 is an exploded view of a possible embodiment of a workpiece positioning device.

The present invention provides a precise positioning device that may be used with a range of workpiece sizes. The desired position may be, for example, a central location over a chuck. Different size disk-shaped workpieces within the given size range may be positioned and/or centered without modifying the positioning device. With reference to FIG. 1, the workpiece positioning device may include a plurality of, preferably at least four (4) and most preferably six (6), rotational shafts 5. The rotational shafts 5 may extend in a generally vertical direction and may be equally spaced apart in a circular pattern. A housing 14 (illustrated in FIG. 2) may be used to provide the structural support needed by the rotational shaft 5 and other components of the positioning device. The housing 14 may also be used to shield other components, for example the coupling mechanism and/or the motor, from particles generated during the processing of the workpiece.

On an upper portion of each rotational shaft 5 is attached one end of a ring bar 3. The ring bars 3 are preferably attached to the rotational shafts 5 in such a manner as to form a substantially horizontal circular pattern as shown in FIG. 1. This arrangement advantageously allows different sized workpieces to be used with the same positioning device. The ring bars 3 may be made to position square, rectangular, or preferably disk-shaped workpieces.

A rest pin 2 may be placed on at least three, and preferably on all, of the ring bars 3. The rest pins 2 provide contact points to support the workpiece while the workpiece is being centered. An alignment pin 3 may also be placed on at least three, and preferably on all, of the ring bars 3. The alignment pins 3 may be used to contact the workpiece during the positioning process. The alignment pins 3 are preferably taller than the rest pins 2 and the alignment pins 3 and rest pins 2 are preferably mounted to a distal end of the ring bars 3. The height of the alignment pins 3 and rest pins 2 may be optimized depending on the thickness of the workpiece. The alignment pins 3 are also preferably positioned behind the rest pins 2 as shown in FIG. 1. The rest pins 2 and alignment pins 3 provide small points of contact with the workpiece thereby minimizing the contamination of the workpiece. Alignment pins 1 and rest pins 2 may also be mounted on the underside of the ring bars 3 with the rest pins 2 bent to 90 degrees to allow a workpiece to rest on it. This would allow a similar alignment method to be used as the method described below.

On a lower portion of the rotational shaft 5 is attached a coupling mechanism 17 for coupling the rotational shafts 5 to a motor 10. The coupling mechanism for transferring motion generated by the motor 10 to rotate the rotational shafts 5 may take many different forms. Methods of transferring motion generated by a motor to a plurality of shafts are well known and particular embodiments of the invention may include these known methods. Non-limiting examples of some of the known methods include various configurations of belt drive pulleys, pulley bearings, belts, and/or various configurations of gears. The motor 10 is preferably an electrical servo motor that may generate a rotational motion in a first and second direction, for example, a clockwise and a counter-clockwise rotation.

The preferred coupling mechanism 17 includes a plurality of belt drive pulleys 11, a plurality of pulley bearings 13, and a serpentine belt 12. The belt 12 may be operably coupled to the motor 10, the plurality of belt drive pulleys 11, and the plurality of pulley bearings 13. Each belt drive pulley 11 is preferably operably coupled to one of the rotation shafts 5. The pulley bearings 13 may be used to keep tension in the belt 12 so that the rotational shafts 5 rotate as the belt 12 is turned. The motor 10 is thus able to simultaneously rotate the plurality of rotation shafts 5 in a clockwise direction or a counter-clockwise direction by simply changing the rotational direction of the belt 12.

A torque limiter may be coupled to, or internal with, the motor 10 to provide a maximum desired pressure on the workpiece during the positioning process. Alternatively, or in combination, one or more sensors may be positioned on the positioning device to measure the pressure exerted against the workpiece. The sensors may be, for example, coupled to one or more of the rotational shafts 5, ring bars 3 or alignment pins 1. The sensors may be in electrical communication with the motor 10 to limit and control the amount of pressure exerted on the workpiece. Excessive pressure might damage or destroy the workpiece, particularly if the workpiece is a semiconductor wafer.

The workpiece positioning device may be automated by one or more computers and may even be automated with the same computer that is used to automate the processing station 16 of which the positioning device may be a part of. In operation, a workpiece 7 may be precisely positioned or centered over a particular location of a processing station 16 by performing the following steps.

Figure 2:
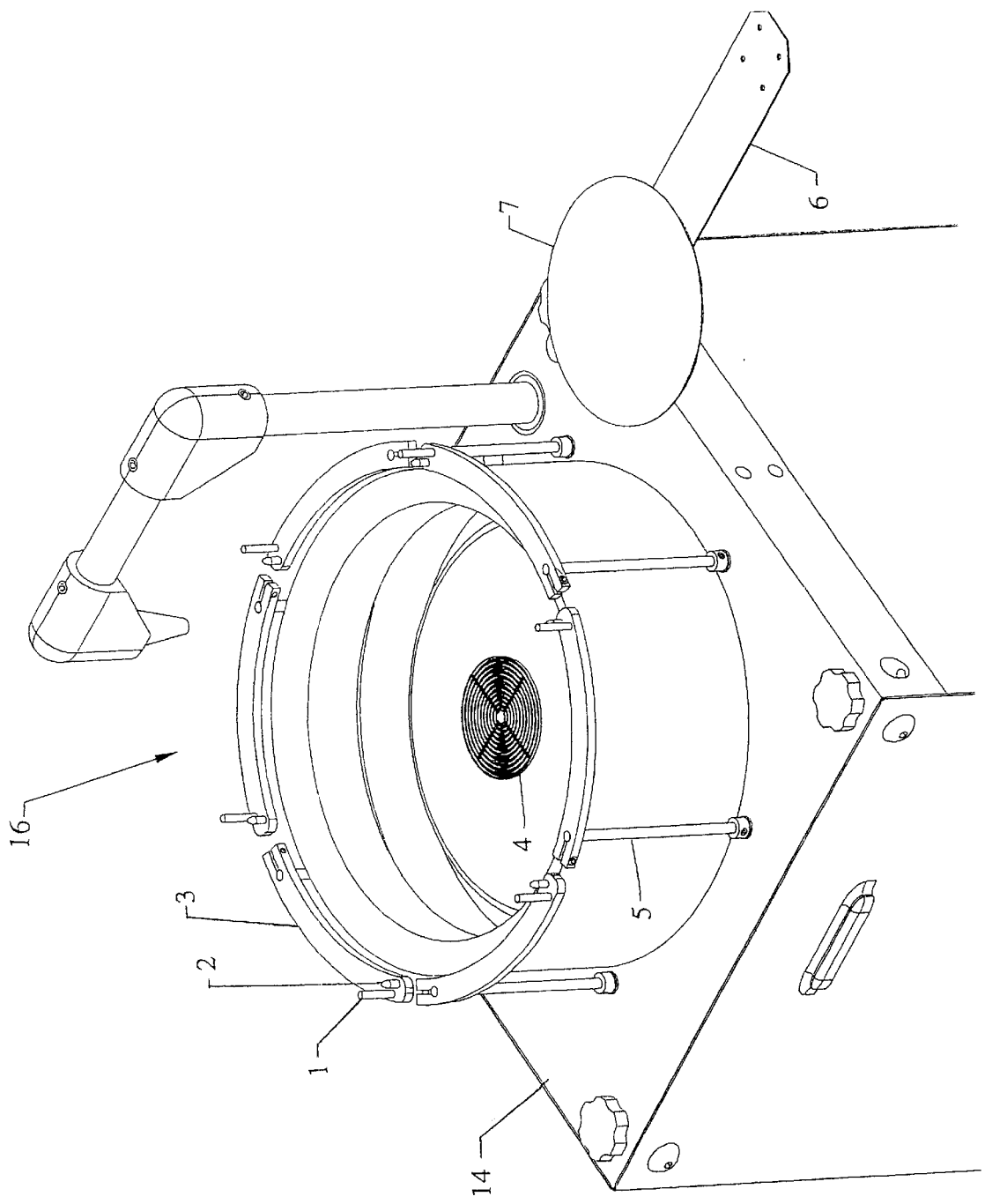
FIG. 2 is a perspective view of the workpiece positioning device illustrated in FIG. 1, a spin bowl, and a workpiece (wafer) prior to loading.

As shown in FIG. 2, the workpiece positioning device may be part of a processing station 16 used to process, for example, semiconductor wafers 7. The positioning device is very versatile and may be used, for example, in a flux spin coating processing station where accurate positioning or centering of a wafer 7 over a chuck 4 is critical to the process. An off-center wafer 7 spun at high speeds (for example, over 1,000 rpms) may become dislodged causing damage to the wafer 7 and possibly the processing station 16.

Figure 3:
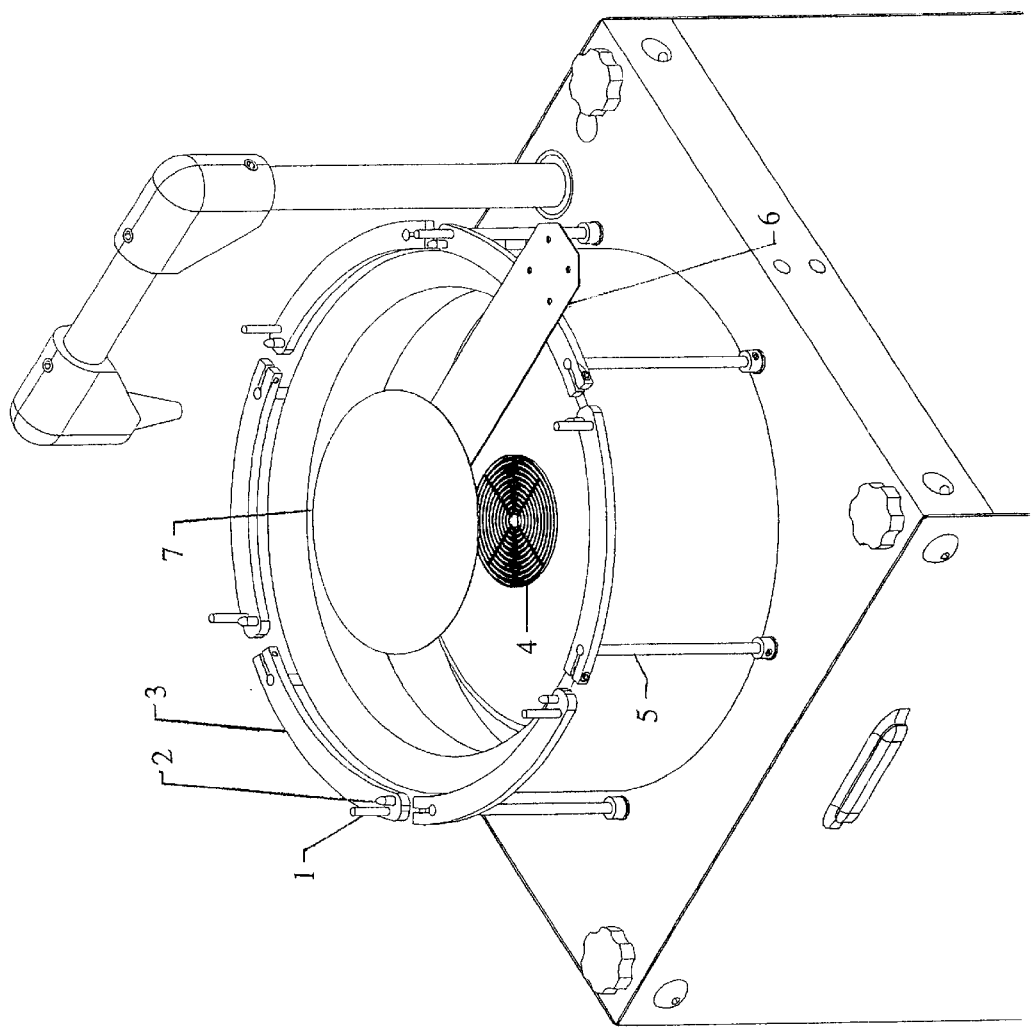
FIG. 3 is a perspective view of a workpiece attached to an end effector positioned over a chuck.
Figure 4:
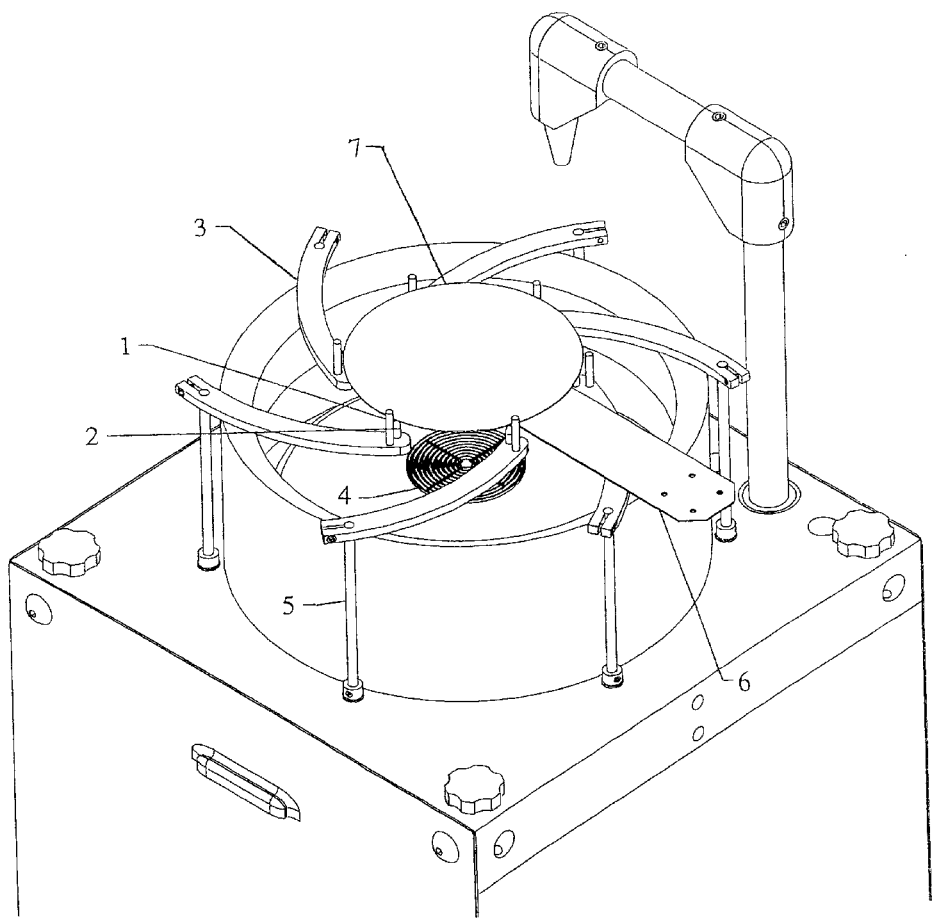
FIG. 4 is a perspective view of the rotational movement of a plurality of ring bars to position the workpiece over a plurality of rest pins.
Figure 10A:
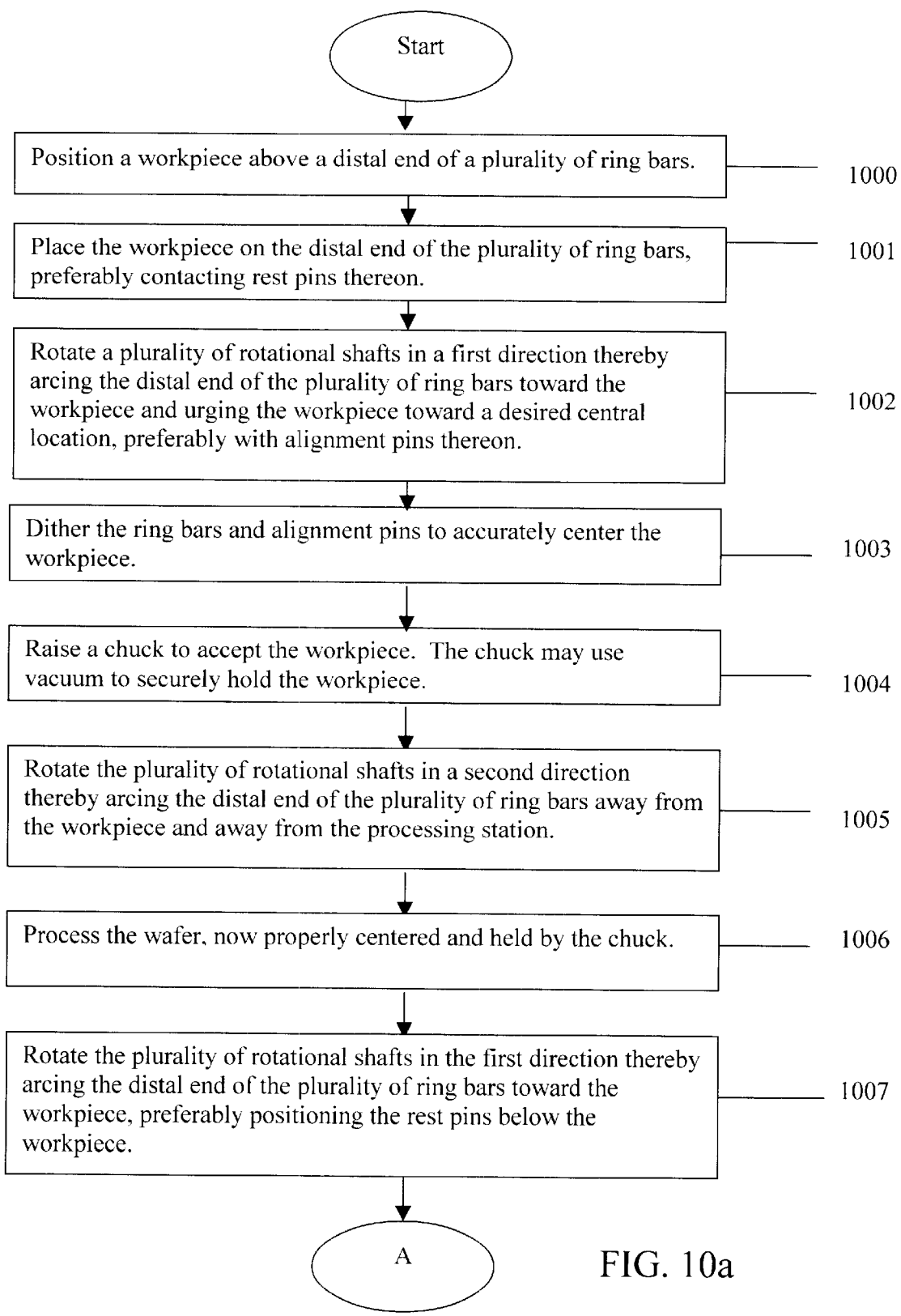
FIGS. 10a and 10b are a flowchart of a first method for practicing the invention.
Figure 10B:
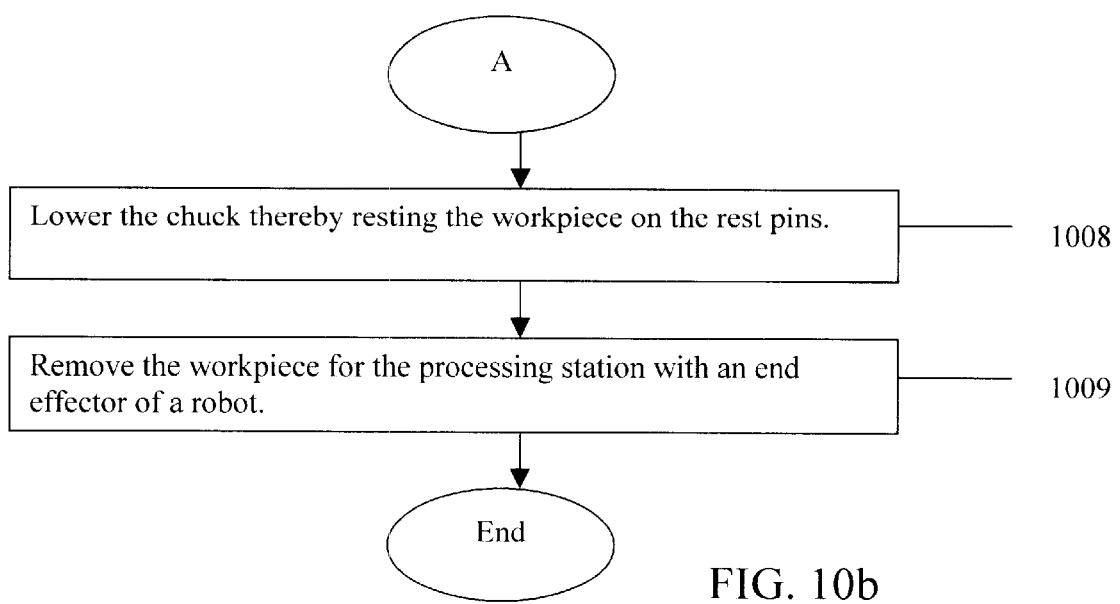
Figure 11A:
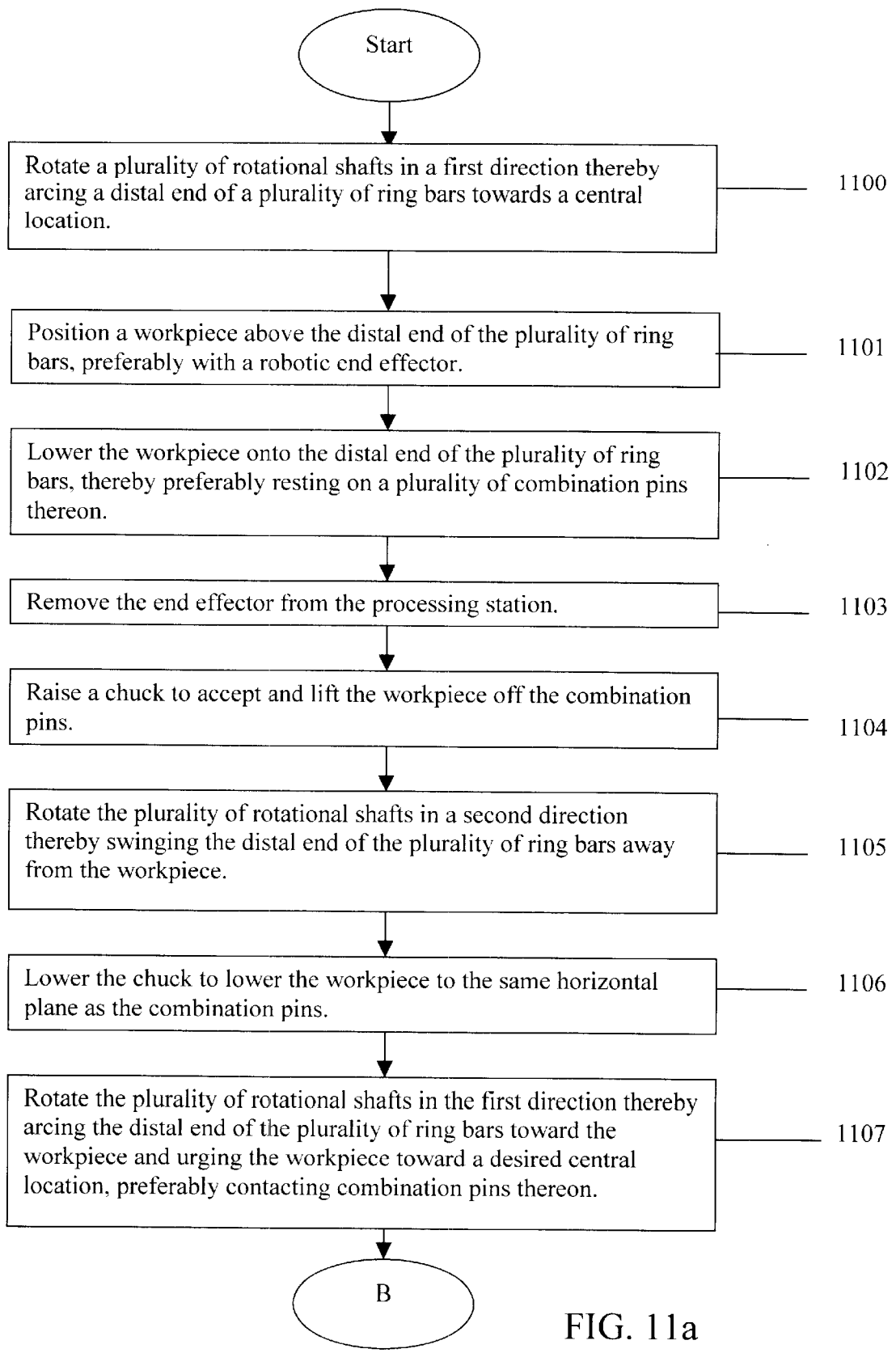
FIGS. 11a and 11b are a flowchart of a second method for practicing the invention.
Figure 11B:
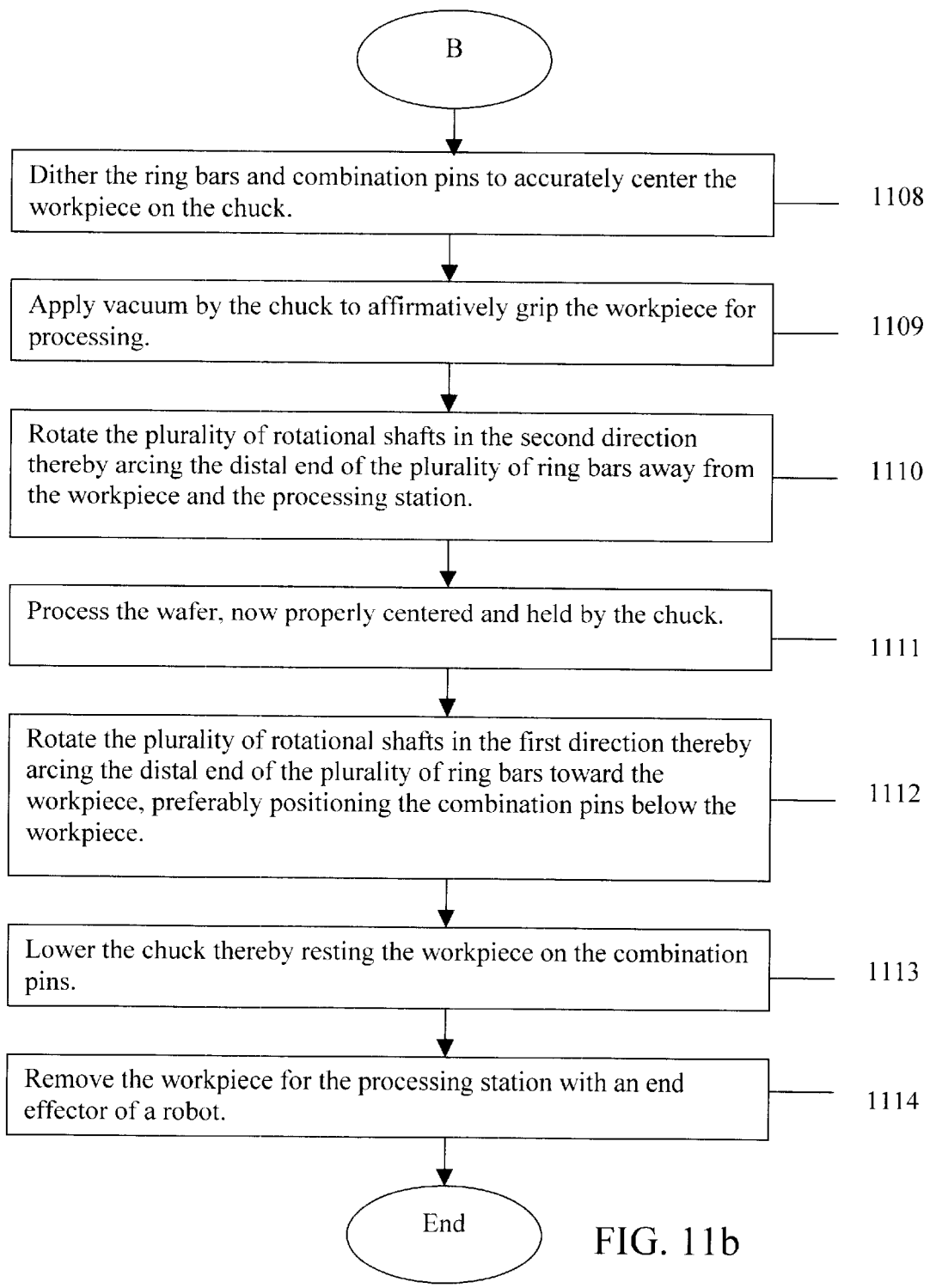

One method of practicing the invention is illustrated in the flowcharts of FIGS. 10a and 10b and will be continually referenced in the following description. As shown in FIG. 2, a workpiece 7 may be held by an end effector 6 of a robot (not shown) near a processing station 16. Other devices, such as a wafer slide or water track, may also be used to transport the wafer 7 to the processing station 16. FIG. 3 illustrates the end effector 6 moving the workpiece 7 slightly above the positioning device. (Step 1000) As shown in FIG. 1, a motor 10 may be used to rotate a plurality of rotation shafts 5 via a coupling mechanism 17. The motor 10 may thus simultaneously rotate a plurality of rotation shafts 5 in the same first direction (counter-clockwise is shown in FIG. 4) thereby arcing the distal end for each of the plurality of ring bars 3 towards the workpiece 7. The rotation of the rotation shafts 5 swings the distal end of a corresponding plurality of ring bars 3 towards and underneath the workpiece 7 as shown in FIG. 4. Advantageously, all the ring bars 3 may swing in the same direction at the same time with the same degree of rotation.

Figure 5:
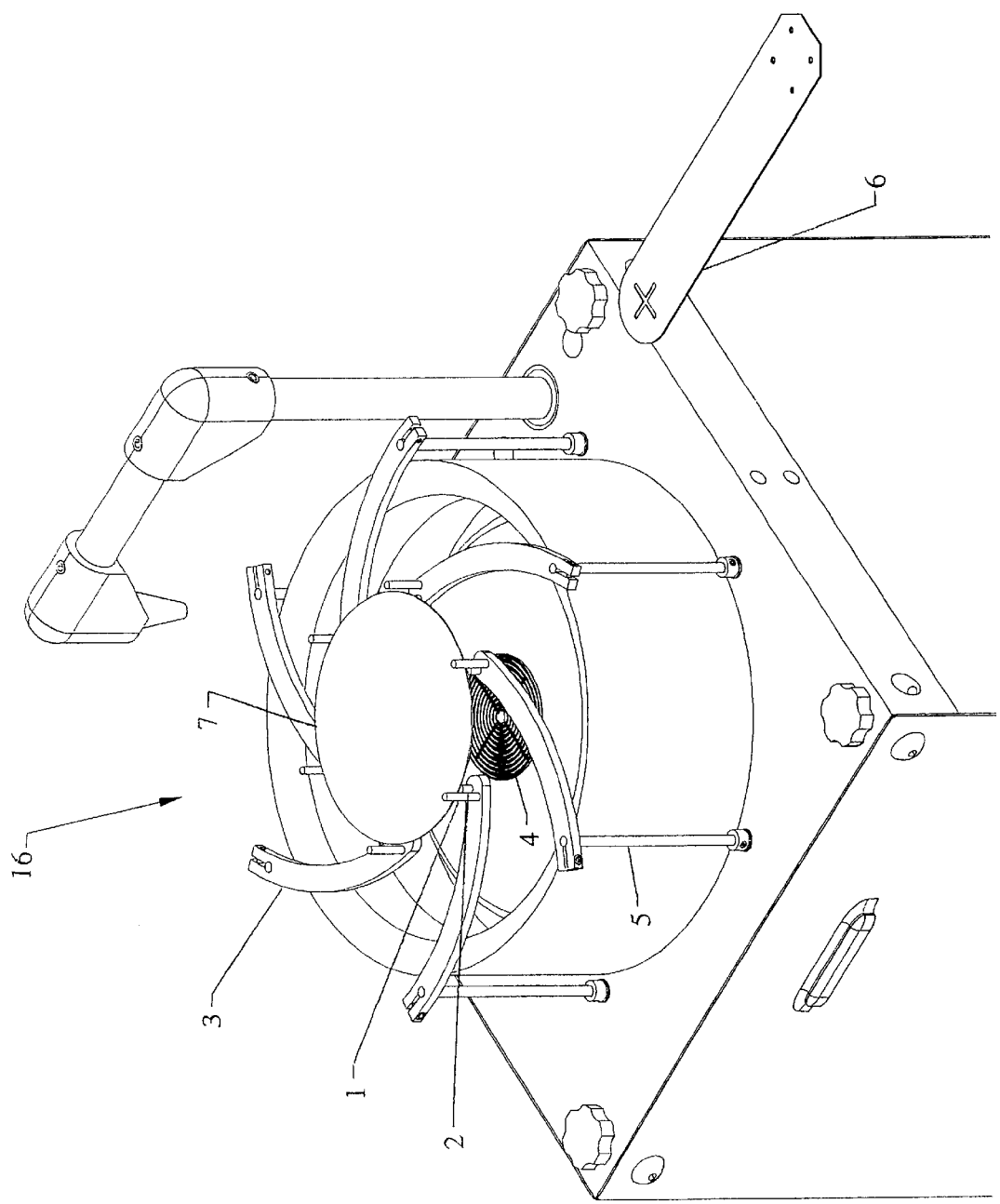
FIG. 5 is a perspective view of the release of the workpiece on the rest pins with positioning being done by the taller alignment pins.

The distal end of the ring bars 3 may be raised to accept the workpiece 7. However, it is preferred that the end effector 6 lowers the workpiece 7 onto the distal end of the ring bars 3 as shown in FIG. 5. The end effector 6 may now be positioned away from the processing station 16 to avoid interfering with the further positioning or processing of the workpiece 7. In a preferred embodiment, a rest pin 2 is connected to the distal end of at least three, and preferably all, of the ring bars 3 to support the workpiece 7. (Step 1001)

The motor 10 via the coupling mechanism 17 (shown in FIG. 1), may once again simultaneously rotate the plurality of rotation shafts 5 in the first direction (counter-clockwise is again illustrated). This motion will again start the arcing of the distal end for each of the plurality of ring bars 3 towards the workpiece 7. This will result in the distal ends of the plurality of ring bars 3 urging the workpiece 7 towards a particular location within the center of the positioning device. Alignment pins I are preferably attached to the distal end of the ring bars 3 to make contact with the edge of the workpiece 7 during the precise positioning of the workpiece 7. This minimizes the contact area and possible contamination of the workpiece 7 by the ring bars 3. (Step 1002) By all the alignment pins 1 applying a substantially uniform urging force, the workpiece 7 will be precisely positioned in the center of the positioning device. In a particularly preferred embodiment, a dithering motion by the alignment pins 1 at the end of the urging step may be used to improve the accuracy of the positioning procedure. (Step 1003)

Figure 6:
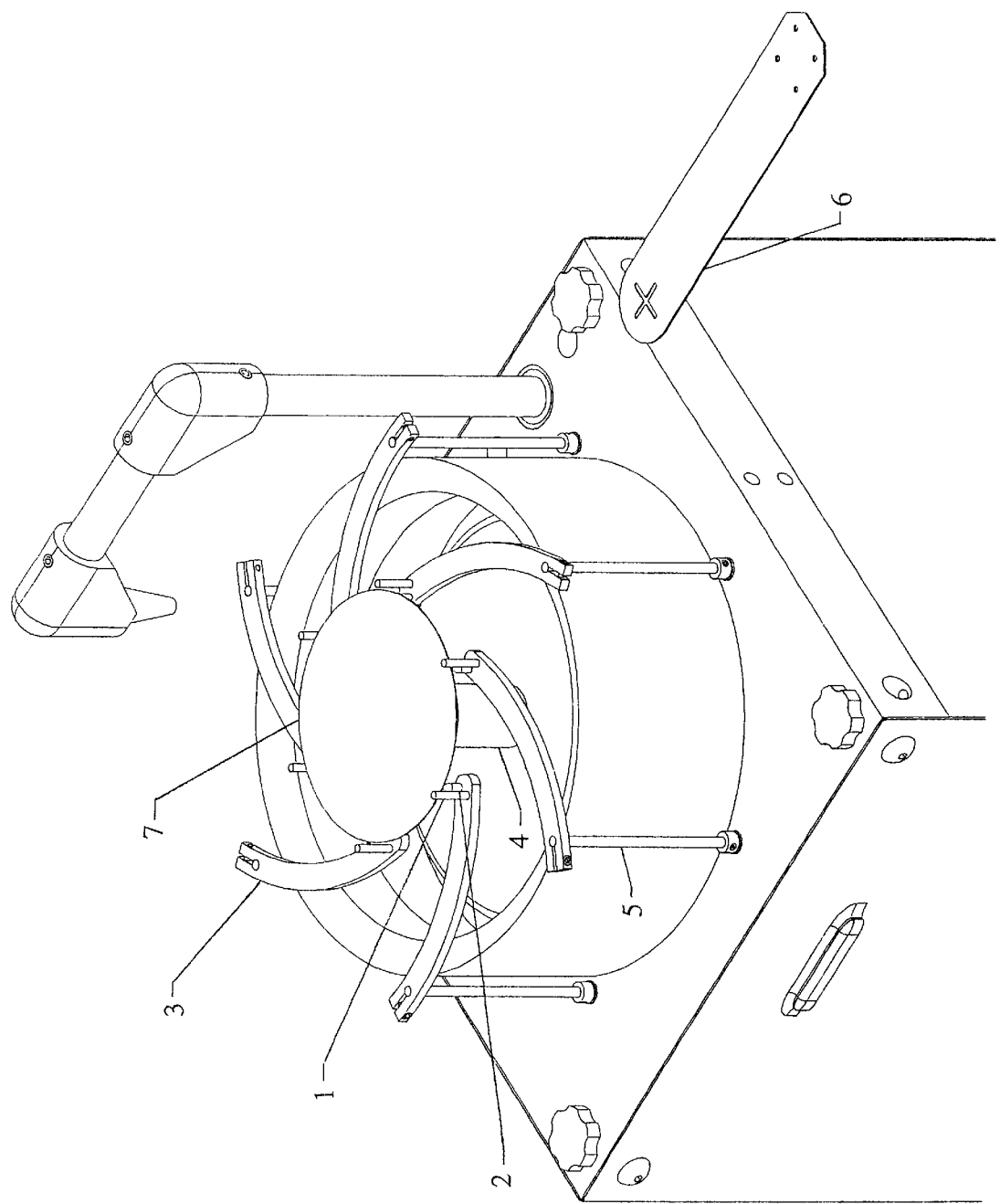
FIG. 6 is a perspective view of a vacuum chuck lifting and receiving the center of the workpiece.
Figure 7:
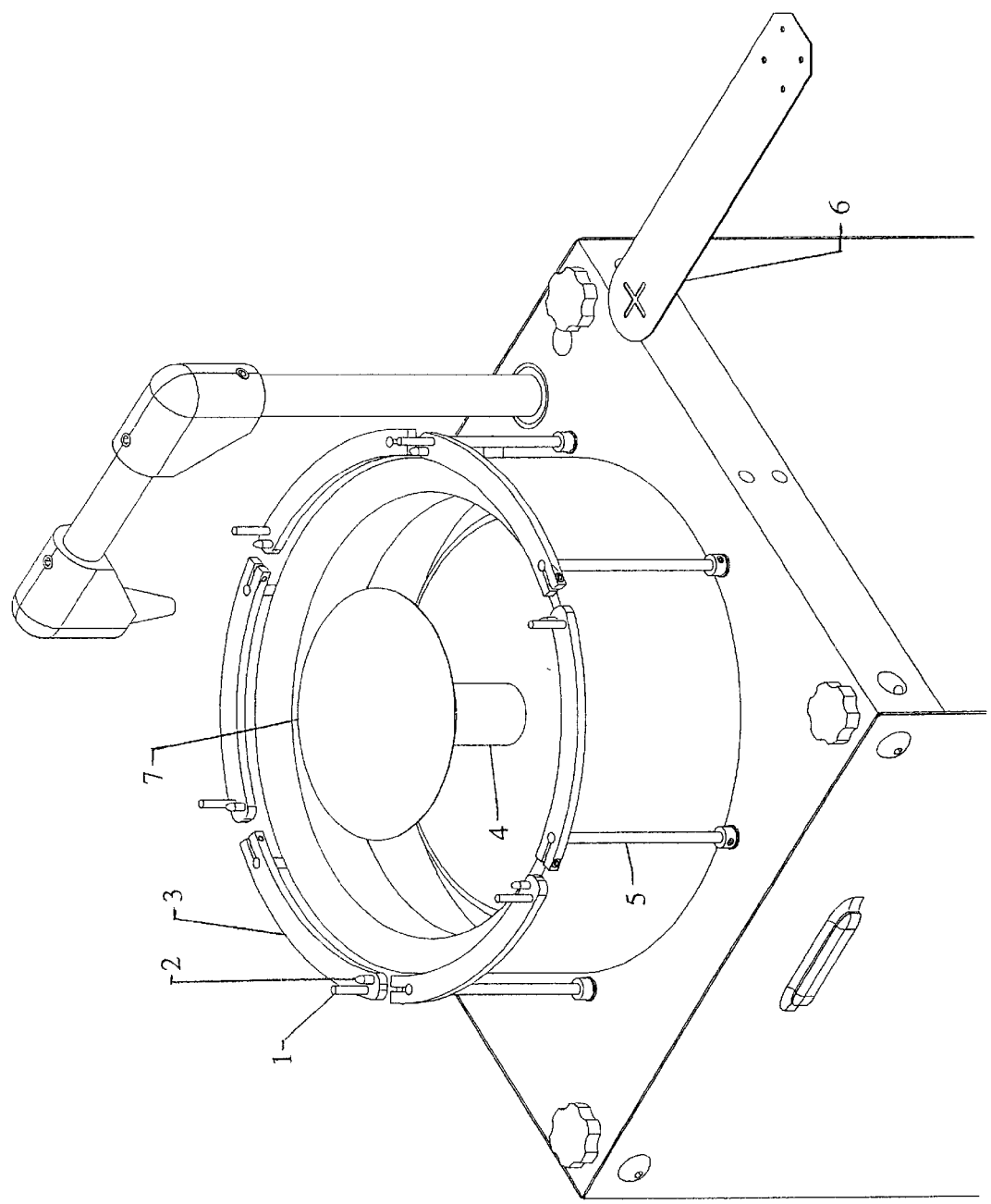
FIG. 7 is a perspective view of the ring bars returning to their original start position.

In one embodiment of the invention, a chuck 4 may be raised to accept and hold, possibly by vacuum, the properly positioned workpiece 7 as illustrated in FIG. 6. (Step 1004) To facilitate processing, the ring bars 3 may be removed from the processing station by rotating the plurality of rotation shafts 5 in a second direction (clockwise is illustrated). This will arc or pivot the distal end for each of the plurality of ring bars 3 away from the workpiece 7 as shown in FIG. 7. (Step 1005)

Figure 8:
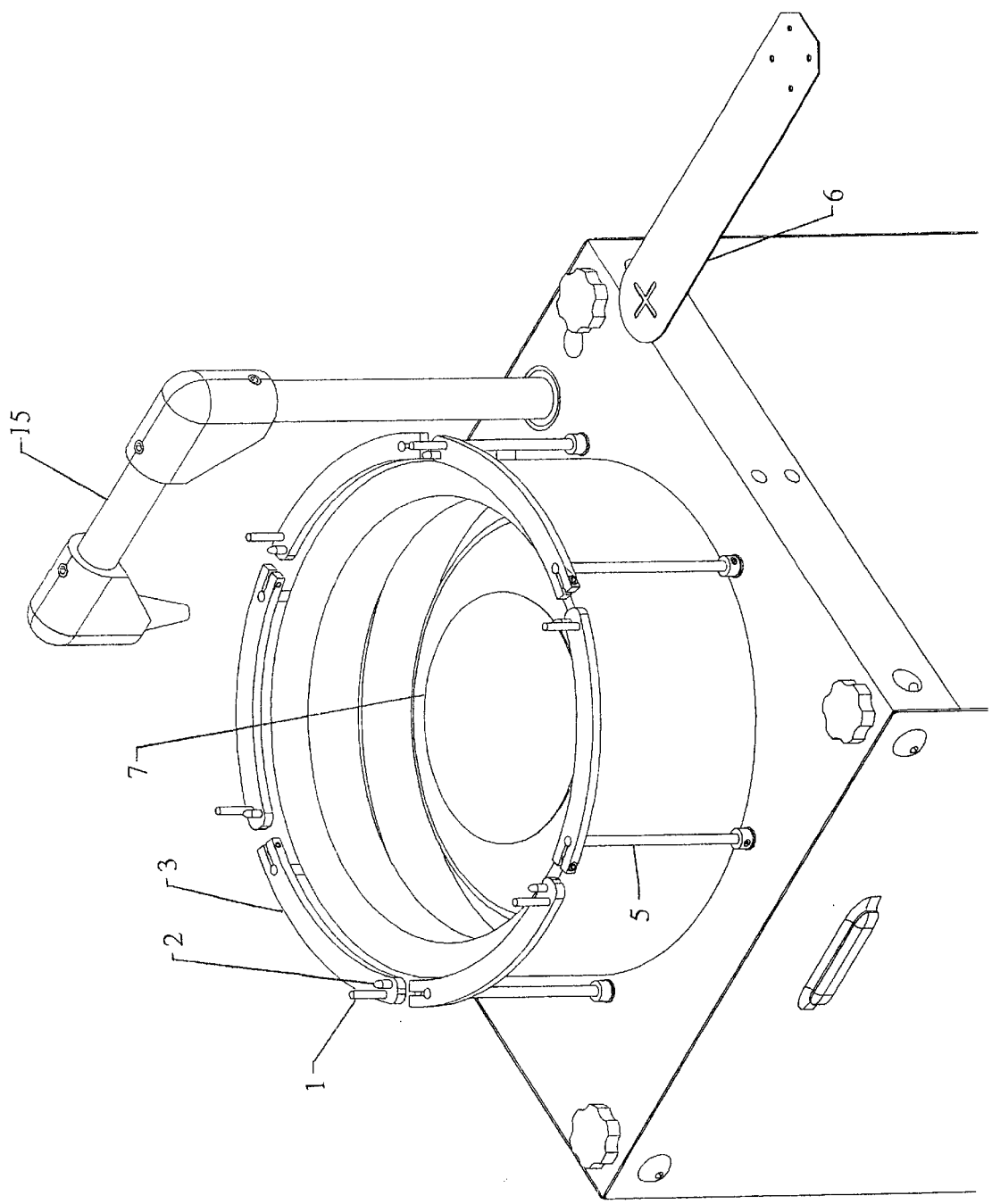
FIG. 8 is a perspective view of the workpiece being lowered by the vacuum chuck ready for processing.
Figure 9:
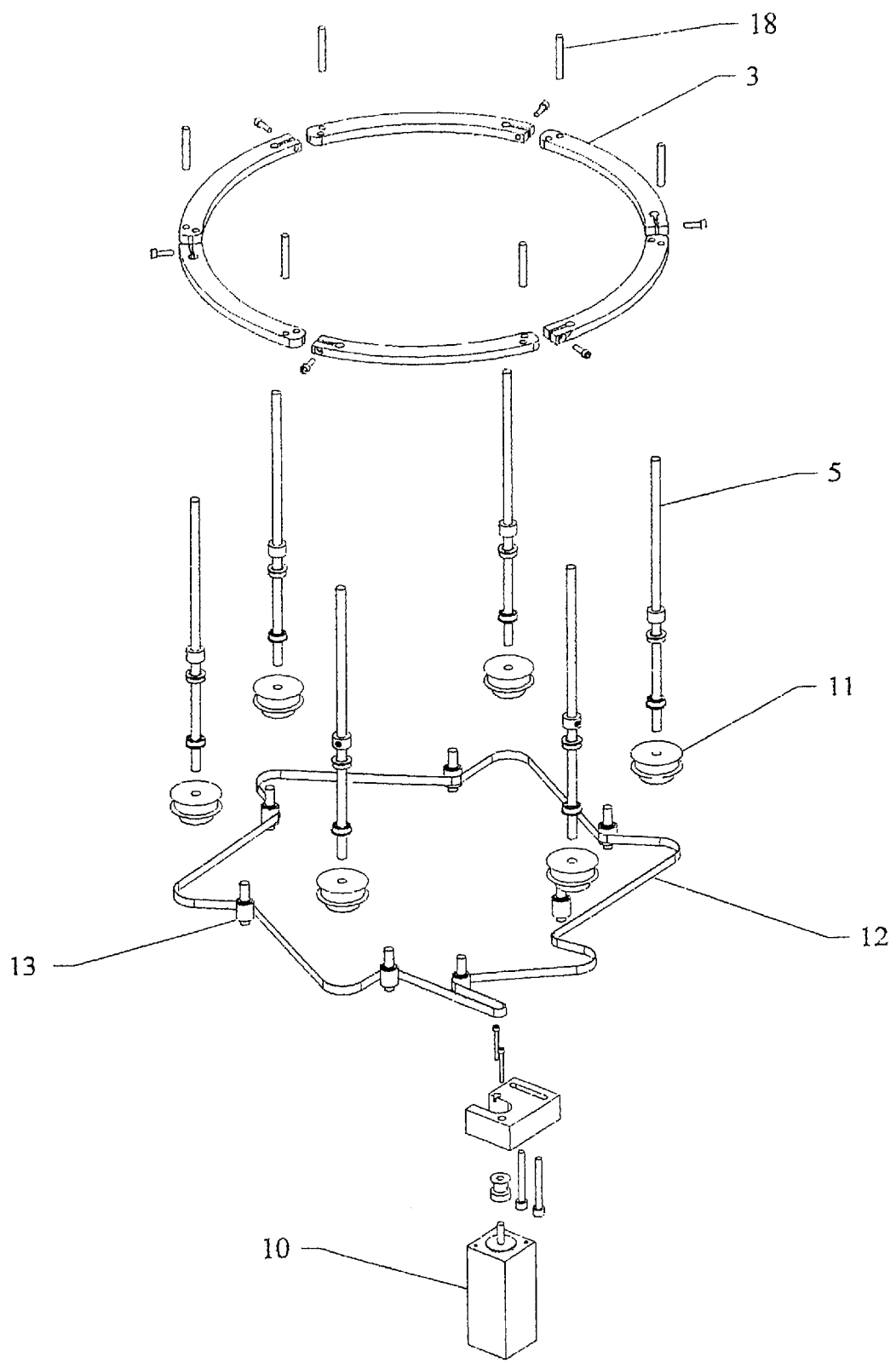
FIG. 9 is a perspective view of an embodiment that utilizes a plurality of combination pins.

The workpiece 7 may now be processed as it is properly positioned, in this case centered on the chuck 4, and the ring bars 3 have been removed from the processing station. Of course, once properly positioned, any number of processes may be performed on the workpiece 7. For example, the chuck 4 may lower (shown in FIG. 8) and rapidly rotate a wafer 7 as flux from a flux dispenser 15 is deposited onto the surface of the wafer 7 during a spin coating process. Other substances may be spin coated on the workpiece 7 in this manner or other processes may take place.

After the workpiece 7 has been processed, the chuck 4 may position the workpiece 7 above the ring bars 3 as illustrated again by FIG. 7. The plurality of rotation shafts 5 may be simultaneously rotated in the first direction (counter-clockwise is illustrated in FIG. 6) thereby arcing the distal end for each of the plurality of ring bars towards and below the workpiece. (Step 1007)

The chuck 4 may lower and rest the workpiece 7 on the rest pins as illustrated in FIG. 5. (Step 1008) This allows space beneath the workpiece 7 for the end effector 6 to grip the workpiece 7, possibly by vacuum, and remove the workpiece 7 from the processing station 16. (Step 1009)

Another method of using the invention will now be described with continuing reference to FIGS. 2, 9, 11a and 11b. This method uses a plurality of combination pins 18, as shown only in FIG. 9, mounted on a distal end of a plurality of ring bars 3. The combination pins 18 may be arced inward toward a central location. (Step 1100) This may be accomplished by rotating the plurality of rotational shafts 5 as previously discussed. A wafer 7 may be lowered onto the combination pins 18, preferably by a robotic end effector 6. (Steps 1101 and 1102) The end effector 6 may be moved away from the processing station (Step 1103) to allow a chuck 4 to raise and lift the wafer 7 off the combination pins 18 (Step 1104). The combination pins 18 may be arced away from the wafer 7 (Step 1105) to give room for the chuck 4 to lower the wafer 7 to the same height as the combination pins 18. (Step 1106) The combination pins 18 may be arced toward the wafer 7 so that the combination pins 18 contact the edge of the wafer 7 and urge the wafer 7 toward a desired position. (Step 1107) The combination pins 18 may be dithered to improve the accuracy of the positioning process. (Step 1108) After proper positioning, the chuck 4 may apply a vacuum to securely hold the wafer 7. (Step 1109) The combination pins 18 may be arced away from the wafer 7 and the processing station 16 to allow for processing of the wafer 7. (Step 1110) The wafer 7 now properly positioned and held by the chuck 4 may be processed as desired. (Step 1111) After the process, the chuck 4 may raise the wafer 7 and allow the combination pins 18 to arc beneath the wafer 7. (Step 1112) The chuck 4 may lower the wafer 7 onto the combination pins 18 (Step 1113), thereby giving room for an end effector 6 or other device to remove the wafer 7 from the processing station 16 (Step 1114). Additional wafers may be processed by repeating this method.

While the invention has been described with regard to specific embodiments, those skilled in the art will recognize that changes can be made in form and detail without departing from the spirit and scope of the invention. For example, coupling mechanisms between a motor and a plurality of shafts are well known and one skilled in the art will recognize that many variations may be made to this feature. The scope and breadth of the invention is defined in the claims.

We claim:

1. A workpiece positioning device for precisely positioning a workpiece comprising:
    a) a housing;
    b) a plurality of rotational shafts mounted from the housing extending generally in a vertical direction;
    c) a motor;
    d) a coupling mechanism coupling the motor to the plurality of rotational shafts; and
    e) a plurality of ring bars, wherein a first end of each ring bar is connected to one of the rotational shafts and each ring bar extends generally in a horizontal direction.

2. The workpiece positioning device of claim 1 further comprising:
    f) a plurality of alignment pins, wherein each alignment pin is mounted on the distal end of the plurality of ring bars.

3. The workpiece positioning device of claim 2 further comprising:
    g) a plurality of rest pins, wherein each pin is mounted on the distal end of the plurality of ring bars.

4. The workpiece positioning device of claim 3 wherein the rotational shafts are substantially equally spaced apart along a circumference of a circle.

5. The workpiece positioning device of claim 4 where in there are more than three rotational shafts.

6. The workpiece positioning device of claim 4 wherein there are six rotational shafts.

7. The workpiece positioning device of claim 4 further comprising:
    f) a torque limiter functionally coupled to the motor.

8. The workpiece positioning device of claim 4 further comprising:
    f) a torque sensor functionally coupled to a rotational shaft, ring bar or alignment pin.

9. The workpiece positioning device of claim 4 wherein the workpiece is a semiconductor wafer.

10. The workpiece positioning device of claim 1 wherein the coupling mechanism comprises:
    a plurality of belt drive pulleys, wherein each belt drive pulley is operably coupled to one of the rotation shafts;
    a plurality of pulley bearings; and
    a belt operably coupled to the motor, the plurality of belt drive pulleys, and the plurality of pulley bearings;
    wherein the motor is able to simultaneously rotate the plurality of rotation shafts in a clockwise direction or simultaneously rotate the plurality of rotation shafts in a counter-clockwise direction.

* * * * *